United States Patent [19]

Love

[11] Patent Number: 4,598,461
[45] Date of Patent: * Jul. 8, 1986

[54] METHODS OF MAKING SELF-ALIGNED POWER MOSFET WITH INTEGRAL SOURCE-BASE SHORT

[75] Inventor: Robert P. Love, Schenectady, N.Y.

[73] Assignee: General Electric Company, Schenectady, N.Y.

[*] Notice: The portion of the term of this patent subsequent to Nov. 29, 2000 has been disclaimed.

[21] Appl. No.: 693,643

[22] Filed: Jan. 22, 1985

Related U.S. Application Data

[60] Division of Ser. No. 579,229, Feb. 13, 1984, Pat. No. 4,516,143, which is a continuation of Ser. No. 336,972, Jan. 4, 1982, abandoned.

[51] Int. Cl.$^4$ ............................................. H01L 21/40
[52] U.S. Cl. ...................................... 29/571; 29/578; 29/580; 29/591; 148/177; 148/187; 357/23.4
[58] Field of Search ................... 148/187, 177; 29/571, 29/578, 580, 591; 357/23.4

[56] References Cited

U.S. PATENT DOCUMENTS

| | | | |
|---|---|---|---|
| 3,845,495 | 10/1974 | Cauge et al. | 357/23 VD |
| 3,988,761 | 10/1976 | Kanazawa | 357/23 VB X |
| 4,181,542 | 1/1980 | Yoshida et al. | 148/187 |
| 4,219,835 | 8/1980 | van Loon et al. | 357/23.4 X |
| 4,271,424 | 6/1981 | Inayoshi | 357/86 X |
| 4,344,081 | 8/1982 | Pao et al. | 29/571 X |
| 4,345,265 | 8/1982 | Blanchard | 148/187 X |
| 4,417,385 | 11/1983 | Temple | 29/571 |
| 4,430,792 | 2/1984 | Temple | 29/571 |
| 4,443,931 | 4/1984 | Baliga et al. | 29/571 |
| 4,466,176 | 8/1984 | Temple | 29/571 |
| 4,516,143 | 5/1985 | Love | 357/23.3 |

OTHER PUBLICATIONS

Kendall, *Applied Physics Letters*, "On Etching Very Narrow Grooves in Silicon", vol. 26, No. 4, Feb. 15, 1975, pp. 195-198.

*Primary Examiner*—George T. Ozaki
*Attorney, Agent, or Firm*—John R. Rafter; James C. Davis, Jr.; Marvin Snyder

[57] ABSTRACT

Double diffused power MOSFET's and methods of manufacture. The source, base and drain regions of a double diffused power MOSFET correspond respectively to the emitter, base and collector of a parasitic bipolar transistor. Double diffused power MOSFET's perform better when provided with an ohmic short between the source and base regions to prevent turn-on of the parasitic bipolar transistor. In one form of ohmic short between the base and source regions, the source terminal comprises a metallic electrode, preferably aluminum, deposited over the source region, and the ohmic short comprises at least one microalloy spike extending from the source terminal metallic electrode through the source region and partly into the base region. Such microalloy spikes are formed by heating the semiconductor substrate after the metallic electrode has been deposited under appropriate conditions. In another form, a V-groove is formed by preferential etching in the source and base regions. In particular the V-groove extends through the source region, with the bottom of the V-groove extending only partly into the base region. A metallic source electrode is deposited over the source region and into the V-groove in ohmic contact with both the source and base regions to form both the source terminal and the ohmic short. These two forms of ohmic short are integral in nature, and facilitate an overall MOSFET structure and manufacturing process characterized by a minimum number of masking steps, self-alignment, and increased active device area.

19 Claims, 11 Drawing Figures

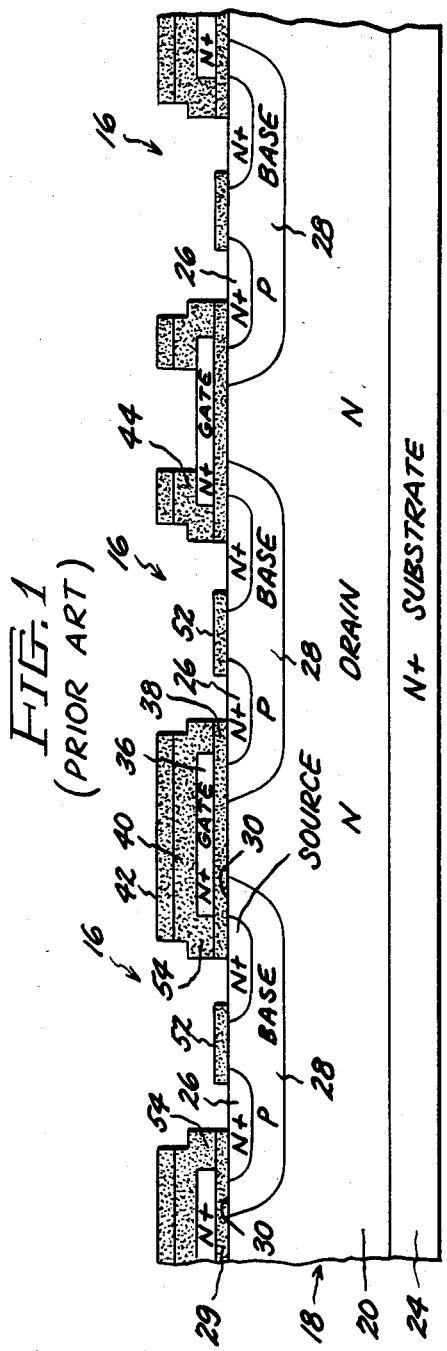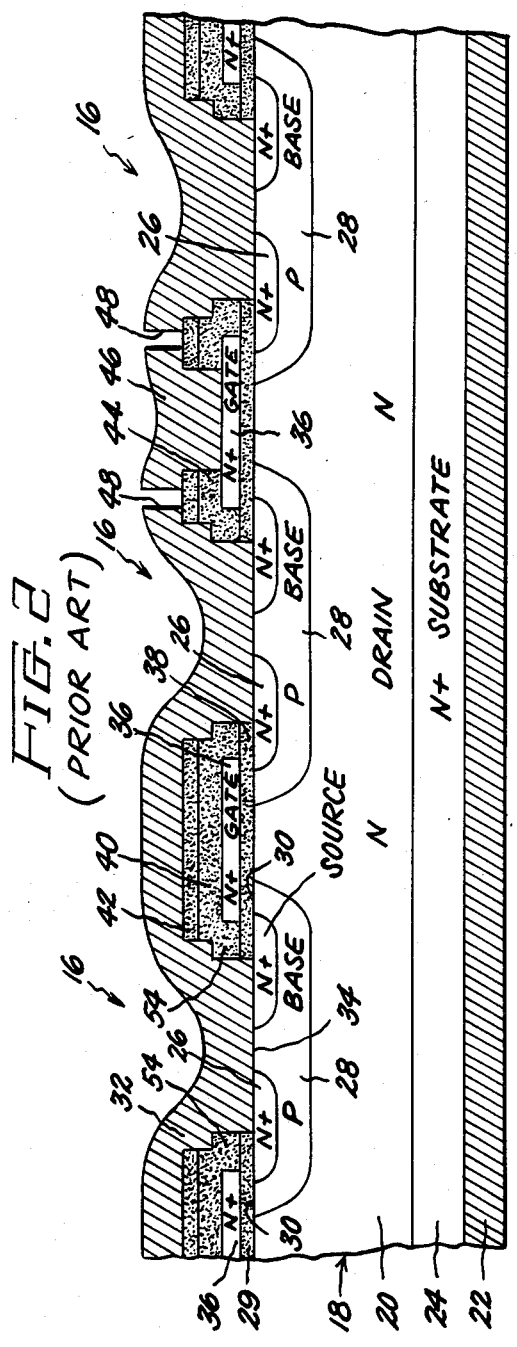

METHODS OF MAKING SELF-ALIGNED POWER MOSFET WITH INTEGRAL SOURCE-BASE SHORT

This application is a division, of application Ser. No. 579,229, filed Feb. 13, 1984. now U.S. Pat. No. 4,516,143 which iteself is a continuation of application Ser. No. 336,972 filed Jan. 4, 1982, now abandoned.

BACKGROUND OF THE INVENTION

The present invention relates generally to power metaloxide-semiconductor field-effect transistors (MOSFET's) manufactured by double diffusion techniques and, more particularly, to methods of manufacturing such transistors with a minimum of masking steps, methods for forming ohmic shorts between the source and base layers during the manufacture of such transistors, and transistors so manufactured.

Known power MOSFET's generally comprise a multiplicity of individual unit cells (numbering in the thousands) formed on a single silicon semiconductor wafer with each device being of the order of 300 mils (0.3 in.) square in size and all cells in each device being electrically connected in parallel. Each cell is typically between 5 and 50 microns in width. As is described more fully hereinbelow, one particular known process for manufacturing power MOSFET's is a double diffusion technique which begins with a common drain region of, for example, N type semiconductor material. Specifically, within the drain region a base region is formed by means of a first diffusion, and then a source region is formed entirely within the base region by means of a second diffusion. If the drain region is N type, then the first diffusion is done with acceptor impurities to produce a P type base region, and the second diffusion is done with donor impurities to produce an N+ type source region.

In a power MOSFET structure, the source, base and drain regions correspond respectively to the emitter, base and collector of a parasitic bipolar transistor. As is known, if this parasitic bipolar transistor is allowed to turn on during operation of the power MOSFET, the blocking voltage and the dV/dt rating of the power MOSFET are substantially degraded. Accordingly, in order to prevent the turn on of the parasitic bipolar transistor during operation of the power MOSFET, the layers comprising the source and base regions are normally shorted together by means of an ohmic connection.

Known power MOSFET designs in manufacture require up to six masking steps, some of which must be aligned to each other with high accuracy to produce working devices. In particular, to form the source-base short, between the first and second diffusion steps a diffusion barrier is applied by means of selective masking over a portion of the base diffusion surface area to prevent the subsequent source diffusion from entering the base diffusion in this area. Thereafter, metallization is applied for the source electrode, and a portion of the source metallization also makes ohmic contact with the previously masked area of the base region.

In this known technique for manufacturing power MOSFET's, not only must the masking pattern to form the source-base shorts be precisely aligned in a special manufacturing step, but the short occupies a significant fraction of the area of each MOSFET unit cell without contributing to its conductivity during the ON state.

SUMMARY OF THE INVENTION

It is an object of the invention to provide a double diffused power MOSFET which may be manufactured while employing a minimal number of masking steps.

It is another object of the invention to provide methods for forming integral source-base shorts in double-diffused power MOSFET's which methods are useful either with MOSFETs formed by prior art masking procedures, or those formed by the subject masking procedure.

Briefly, and in accordance with one aspect of the invention, a double-diffused power MOSFET comprises individual cells formed on a semiconductor substrate including a drain region of one conductivity type, for example N type, and having a principal surface. A metallized drain terminal is electrically connected to the drain region, typically on the other surface thereof. In order to define a base region, a first region of opposite conductivity type (in this example P type) is formed in the drain region. The first region is of limited lateral extent, and has a periphery terminating at the principal surface. To define a source region, a second region of the one conductivity type (in this example N type) is formed entirely within, and of, lesser lateral extent and depth than the base region. The second region has a periphery terminating at the principal surface within and spaced from the periphery of the base region such that at the principal surface the base region exists as a band of the opposite conductivity type (in this example P type semiconductor material) between the source region and the drain region, both of N type semiconductor material. A source terminal is electrically connected to the second region. A conductive gate electrode and a gate insulating layer are formed on the principal surface at least laterally over the band of the first region, and a gate terminal is electrically connected to the gate electrode. Finally, an ohmic short is formed between the first and second regions (base and source regions) below the principal surface.

In one form of ohmic short between the base and source regions, the source terminal comprises a metallic electrode, preferably aluminum, deposited over the source region, and the ohmic short comprises at least one microalloy spike extending from the source terminal metallic electrode through the second region and partly into the first region. Such microalloy spikes are formed by heating the semiconductor substrate after the metallic electrode has been deposited under appropriate conditions.

In another form, a V-groove is formed by preferential etching in the source and base regions. In particular, the V-groove extends through the source region, with the bottom of the V-groove extending only partly into the base region. A metallic source electrode is deposited over the source region and into the V-groove in ohmic contact with both the source and base regions to form both the source terminal and the ohmic short.

From the foregoing and from the detailed description hereinbelow, it will be appreciated that the methods of forming the integral source-base shorts in accordance with the invention and the shorts so formed are an extremely significant aspect because they facilitate the overall MOSFET structure and manufacture process with self-alignment and a minimum number of masking steps.

Briefly, and in accordance with another aspect of the invention, a method of manufacturing a double-diffused power MOSFET begins with the step of providing a silicon semiconductor wafer substrate including a drain region of one conductivity type, for example N type, having a principal surface. Next, a first or gate insulating layer, a conductive gate electrode layer (for example, highly doped N+ type polysilicon), a second insulating layer, and a third insulating layer are successively formed on the principal surface, the third insulating layer being the top.

Significantly, a total of only three masking steps are required. The first mask is applied over the third insulating layer with a window for ultimately defining at least one base region and at least one source region. Next, through successive etching steps, openings defined by the windows in the first mask are made through at least the third insulating layer, the second insulating layer, and the conductive gate electrode layer. During the etching, undercutting of the conductive gate layer occurs. The first mask is then removed.

Next, two impurity introduction steps are performed, the windows in the various insulating layers serving as impurity barriers. Specifically, the first introduction step defines a base region by introducing into the drain region through the openings defined by the first mask impurities appropriate to form a first region of opposite conductivity type to the drain region, for example, acceptor impurities to form P type semiconductor material. The lateral extent of the base region is determined in part by the size of the openings defined by this first mask, as well as by the duration of the introduction of impurities and other processing parameters.

The source region is defined by the second impurity introduction step, which involves introducing into the base region, also through the openings defined by the first mask, impurities to form a second region of the one conductivity type (in this example, N type). Significantly, there is no need for any additional impurity barrier over any part of the base region. The source region is formed entirely within the base region such that at the principal surface the first region exists as a band of opposite conductivity type between the source and the drain region. During the source introduction, a layer of silicon dioxide is grown at least on the sidewalls of the opening through the gate electrode layer.

Next, an insulating layer on the surface of the source region is removed with a collimated beam in an area defined by the opening in the third insulating layer defined by the first mask. The collimated beam allows this etching to proceed without removing the silicon dioxide layer on the side walls of the opening through the gate electrode layers.

The second masking step defines gate contact areas on a portion of the device other than at the location of the source region. Using windows in the second mask, the third insulating layer and the second insulating layer are successively etched through to the polysilicon gate electrode layer. Thereafter, the second mask is removed.

Next, electrode metal such as aluminum is coated onto the wafer and is then patterned by means of a third mask to form source and gate electrode layers.

Finally, in order to produce an ohmic short between the first and second regions comprising the base and source regions, the wafer is heated to form at least one microalloy spike extending from the metal source electrode through the source region and partly into the base region.

In another method in accordance with the invention the overall device is similarly formed, but the source-base short is formed by preferential etching to form a V-groove, and then filling the V-groove with the source electrode material in ohmic contact with both the source and base regions. More particularly, after the insulating layer on the surface of the source region is removed with a collimated beam, the second and first layers are preferentially etched to form a V-groove, the V-groove extending through the second region and the bottom of the V-groove extending only partly into the first region.

At this point, the second mask is provided with windows for defining the gate contact area, and the third insulating layer and the second insulating layer are successively etched through to form an opening for the gate electrode. The second mask is removed.

Finally electrode metal is coated onto the wafer and is then patterned by means of a third mask to form source and gate electrode layers. The source layer extend into the V-groove in ohmic contact with both the second and first regions.

While the methods of forming source-base shorts in accordance with the invention are particularly advantageous when employed in combination with the minimum masking technique of the present invention providing a double-diffused power MOSFET with self-aligned channels, they are also applicable to power MOSFETs formed by means of other techniques.

BRIEF DESCRIPTION OF THE DRAWINGS

While the novel features of the invention are set forth with particularity in the appended claims, the invention, both as to organization and content, will be better understood and appreciated from the following detailed description taken in conjunction with the drawings, in which:

FIG. 1 is a sectional side view depicting one step in the manufacture of a prior art double-diffused power MOSFET showing diffusion barriers for base shorting bars still in place;

FIG. 2 is a sectional side view depicting a prior art double-diffused power MOSFET substantially completed;

DESCRIPTION OF THE PREFERRED EMBODIMENTS

Figure 3:
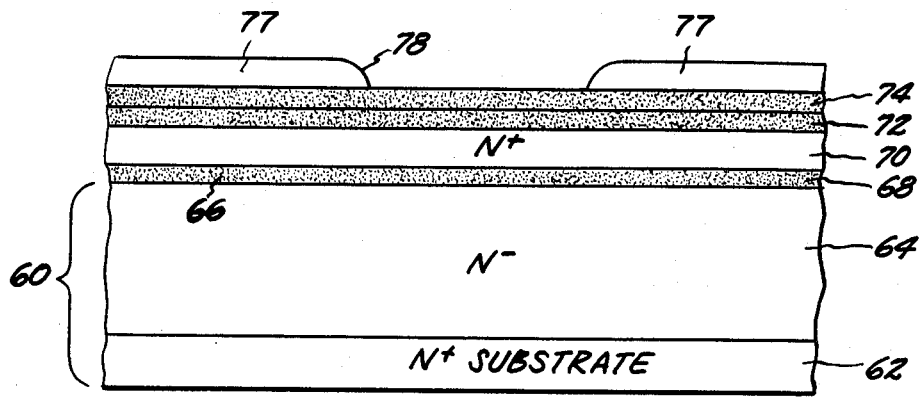
FIG. 3 depicts a semiconductor wafer after initial processing to form a self-aligned power MOSFET cell in accordance with the present invention.

It is believed that the present invention will be better understood and appreciated in view of the details of one form of prior art double-diffused power MOSFET described herein with reference to FIGS. 1 and 2. In particular, the prior art MOSFET manufacturing technique depicted in FIGS. 1 and 2 requires up to six masking steps which must be aligned to each other with high accuracy to produce working devices.

With reference to FIG. 2 in particular, a completed prior art power MOSFET comprises a multiplicity of unit cells 16, numbering in the thousands, formed in a single semiconductor wafer 18 and electrically connected in parallel on each device. The unit cells 16 have a common drain region 20 of N or N− type silicon semiconductor material having a common metal electrode 22 in ohmic contact through a highly doped N+ substrate 24.

The unit cells 16 have individual source 26 and base regions 28 produced by a double diffusion technique hereinafter described. At the substrate surface 29, each base region 28 exists as a band 30 of P type semiconductor material between N type source 26 and drain 20 regions. A metal electrode 32 covers most of the device, and makes ohmic contact with both the source 26 and base 28 regions, contact to each base region 28 being facilitated by an extension 34 of the base region 28 up to the surface of the semiconductor wafer. This extension 34 may be viewed as a shorting bar, and necessarily occupies surface area. Thus the metal electrode 32 serves not only as a common source contact, but as the requisite source-base short.

To produce an enhancement mode channel for field-effect transistor operation, a conductive gate electrode 36 separated by an insulating gate oxide layer 38 is positioned on the surface 29 of the semiconductor wafer 18 at least laterally over the band 30 of P type material comprising the base region 28. While many MOSFET's include a metal gate electrode, for convenience in fabrication power MOSFET's typically employ an equivalent highly-doped and therefore highly conductive layer of polycrystalline silicon, and the name MOSFET is retained. The individual segments 36 of gate electrode material comprise a single perforated layer and thus are electrically connected together even though not apparent from the sectional side view of FIG. 2.

The upper surfaces of the gate electrode segments 36 are protected by suitable insulation, for example a silicon dioxide layer 40 and a silicon nitride layer 42.

For gate terminals, gate contact windows 44 are provided, and metallization 46 is applied through these windows in ohmic contact with the gate electrode material 36. The upper surface of the completed device is essentially completely covered with metallization, except for insulating gaps 48 between the source-base metallization 32 and the gate metallization 46.

A multiplicity of the unit cells 16 are formed, numbering in the thousands as previously stated. No particular plan view is depicted herein as a variety of known arrangements are suitable. For example, the individual cells 16 may be arranged in a closely-packed hexagonal pattern, squares, or rectangular strips. While there are many thousands of unit cells 16, only a few gate contact windows 44 are provided. Due to the relatively little gate current which flows extremely low resistance to the interconnected gate electrodes is not required.

In operation, each unit cell 16 is normally nonconducting, with a relatively high withstand voltage. When a positive voltage is applied to the gate electrode layer 36 via the gate terminal metallization 46, an electric field is created which extends through the gate insulating layer 38 into the base region 28 and induces a thin N type conductive channel just under the surface 29 below the gate electrode 36 and insulating layer 38. As is known, the more positive the gate voltage, the thicker this conductive channel becomes, and the more working current flows. Current flows horizontally near the surface 29 between the source 26 and drain 20 regions, and then vertically through the remaining drain region 20 and through the substrate 24 to the metal drain terminal 22.

With reference now to both prior art FIGS. 1 and 2, a typical prior art manufacturing process begins with an N/N+ epitaxial wafer 18 of suitable epitaxial thickness and resistivity to support the desired voltage. In particular, the wafer 18 comprises the N+ silicon substrate 24 approximately 15 mils thick and having a resistivity in the order of 0.01 ohm-centimeter. The N doped portion 20 of the wafer 18 ultimately forms a common drain region 20 of the power MOSFET.

The wafer 18, and particularly the drain region 20, have a principal surface 29 on top of which a number of layers are successively applied. Specifically, the gate oxide layer 38 is first grown on the surface 29 of the drain region 20 by heating in a furnace in the presence of oxygen. Next, the highly-conductive polysilicon gate electrode layer 36 is deposited, which may comprise, for example, 1.1 microns of polysilicon which has been highly doped with, for example, phosphorus.

Next, another layer 40 of silicon dioxide is grown on top of the polysilicon gate layer 36. This in some cases is followed with the top layer of silicon nitride 42

After the wafer and uniform surface layers are complete, a fine-geometry photoresist mask (not shown) is applied to define the location of the P diffusions for the base regions, and the four top layers 42, 40 36 and 38 are appropriately etched through to the surface 29 of the drain region 20. Following this, to form the base region 28, a P diffusion is performed, for example, three microns thick, by diffusing appropriate acceptor impurities into the drain region 20. A temporary oxide layer 52 is grown on the wafer surface 50 simultaneously with the P diffusion.

Next, in this prior art process, prior to the second diffusion a diffusion barrier comprising portions of the oxide layer 52 is formed by means of a fine-geometry photoresist mask (not shown) requiring relatively precise alignment to leave the oxide 52 which was grown during the first diffusion step only over part of the base region.

After removal of the photoresist mask, the second diffusion step is performed by diffusing appropriate donor impurities into the base region to form the N+ source regions 26. At the same time, an oxide lip 54 is grown at the edge of the polysilicon gate electrode 36.

Next, a layer of silicon dioxide (not shown) is deposited over the entire surface of the wafer, and a third mask is provided for defining contact areas. By means of this third mask, the oxide 52 over the extension 34 of the P base region 28 to the surface is etched through, as well as the just-deposited silicon dioxide over the N+ source region 26. The top layers 42 and 40 are also etched through to form the gate contact window 44.

Next, metal, preferably aluminum, is evaporated onto the wafer and by means of another mask, etched so as to leave the electrode metallization 32 and 46 over substantially the entire cell 16, except for the insulating gaps 48 surrounding the gate electrode terminal 46. With this prior art construction, the source electrode 32 makes ohmic contact with both the source region 26 and also the P base region 28 via the extension 34. Thus, a source-base short is provided to prevent the turn on of the parasitic bipolar transistor.

It will be appreciated that this conventional process for forming a power MOSFET, with integral short between the source and base regions, requires a number of masking steps, alignments, as well as a source diffusion barrier.

The remaining drawings FIGS. 3-11 depict methods in accordance with the present invention, and power MOSFET's formed thereby.

Referring now to FIG. 3, the formation of a self-aligned double-diffused power MOSFET with integral source-base short in accordance with the present invention begins with an N/N+ epitaxial wafer 60 having a highly-doped N+ bulk substrate 62 and an expitaxially grown drain region 64 of one conductivity type, for example, N type semiconductor, having a principal surface 66. Next, a first or gate insulating layer 68 is formed and is preferably in the form of a single layer of silicon dioxide grown by heating the wafer 60 in a furnace in the presence of oxygen. Alternatively, the first insulating layer 68 could comprise, for instance, a layer of silicon dioxide grown in the foregoing manner, over which a layer of silicon nitride is deposited. This is followed by the deposition of the conductive gate electrode layer 70 which, by way of example, may comprise a 1.1 micron layer of polysilicon which has been highly doped with phosphorus to form a highly-conductive N+ layer. Thus, in this construction, the gate electrode is not actually metal, but is the electrical equivalent.

Figure 9:
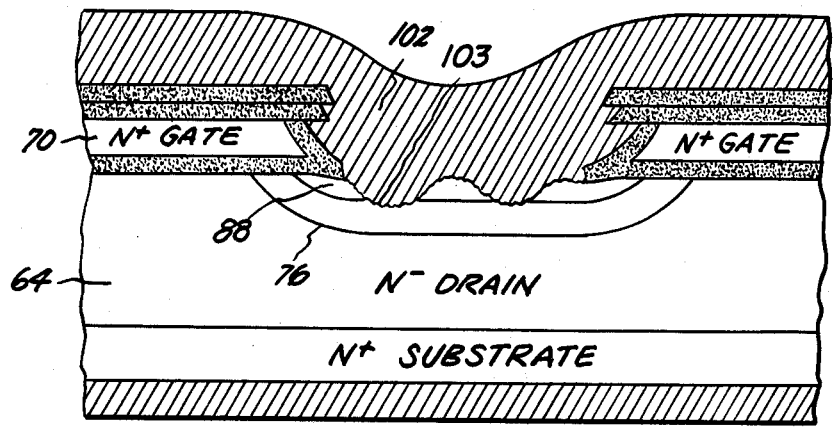
FIG. 9 depicts integral source-base shorts formed by the microalloy technique of the present invention.

Next, a second insulating layer 72, preferably comprising a single layer of silicon dioxide, is formed on the polysilicon layer 70. The second insulating layer typically is 6 to 7 thousand angstroms thick in order to provide good dielectric isolation between a completed conductive gate layer 70 and a completed source electrode layer 102, as depicted in FIG. 9. The forming of the second insulating layer 72 is followed by the deposition on top of the layer 72 of a third insulating layer 74, preferably comprising a single layer of silicon nitride, or alternatively, for instance, a single layer of aluminum oxide. (The purpose served by the third insulating layer 74 is discussed below.) The four layers 68, 70, 72 and 74 are done consecutively, and are present everywhere on the wafer surface.

Next, by means of conventional photoresist techniques, a first mask 77 is provided over the third insulating layer 74, with windows 78 which ultimately define the source and base regions. While this first mask 77 is a relatively fine-geometry mask, no alignment is required since it is the first mask and the wafer up to this point simply comprises uniform layers. Significantly, in the process of the present invention the first mask 77 is the only fine-geometry mask. FIG. 3, then, illustrates the wafer immediately after the first mask 77 has been provided.

Figure 4:
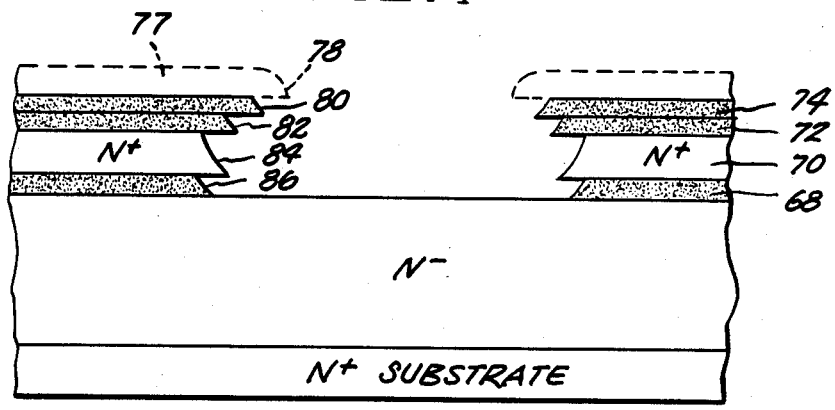
FIG. 4 depicts the condition of the cell after a subsequent step where the top four layers have been etched through, and a first mask removed.

Referring next to FIG. 4, in the preferred method, the third insulating layer 74, the second insulating layer 72, the conductive gate electrode layer 70, and the first insulating layer 68 are successively etched through to form respective openings 80, 82, 84, and 86 in the areas defined by the windows 78 in the first mask 77, with undercutting of the conductive gate layer 70 being necessary. More particularly, the upper layer 74, where it comprises a single layer of silicon nitride, is plasma etched away. Then, the next lower layer 72, where it comprises a single layer of silicon dioxide, is chemically etched away. Then the polysilicon layer 70 is plasma etched away with the etching continued for a sufficiently long time to produce significant sideways etching of the polysilicon layer 70 for reasons which will hereinafter be apparent. For example, in the order of 1.0 microns of undercutting is sufficient. Finally the first layer 68 where it comprises a single layer of silicon dioxide, is chemically etched away. The photoresist layer 77 is then removed, leaving the wafer in the condition depicted in FIG. 4.

Figure 5:
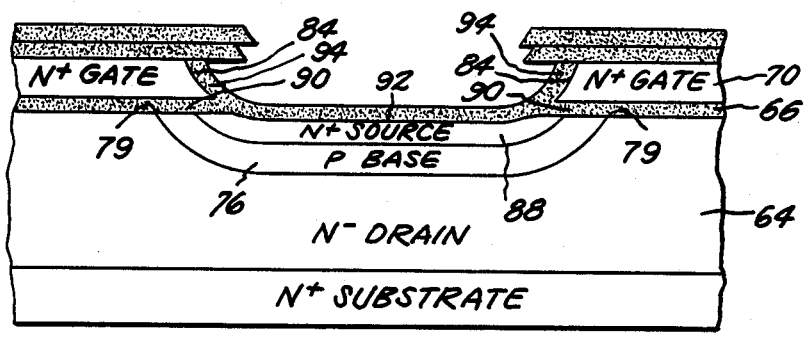
FIG. 5 depicts the wafer after the base and source diffusions.

Referring next to FIG. 5, after appropriate cleaning, the transistor base region 76 is introduced into the drain region 64, preferably by means of first a diffusion. Specifically, impurities appropriate to form a first region of opposite conductivity type are diffused into the drain region 64 through the openings 80, 82, 84 and 86 defined by the first mask 77. In this example, acceptor impurities are diffused to provide P type semiconductor material for the base region 77. The first diffusion to form the base region 76 is, for example, approximately 3 microns deep. The lateral extent of the base region 76 is determined in part by the size of the openings 80, 82, 84 and 86 defined by the first mask 77, as well as by the other process parameters, such as duration, temperature and pressure. The base diffusion region 76 has a periphery 79 terminating at the principal surface 66.

Next, without any further masking steps with attendant alignment, the transistor source region 88 is introduced into the base region 76, preferably by means of a second diffusion step. More particularly, through the same openings 80, 82, 84, and 86 impurities appropriate to form a second diffused region 88 of the one conductivity type are introduced, in this example, donor impurities to form a highly-doped N+ type semiconductor source region 88. This second diffusion is in the order of 1.0 micron deep, and is formed entirely within and has lesser lateral extent and depth than the base region 76 formed during the first diffusion. As a result, at the principal surface 66 the base region 76 exists as a band 90 of the opposite conductivity type (P type) between the source region 88 (N+ type) and the drain region 64 (N− type).

Additionally, during the second diffusion step to form the source region 88, a layer 92 of silicon dioxide is grown over the surface of the source region 88, and an extension 94 of this layer 92 is grown on the sidewalls 84 of the polysilicon gate electrode 70. At this stage the wafer exists as depicted in FIG. 5.

Figure 6:
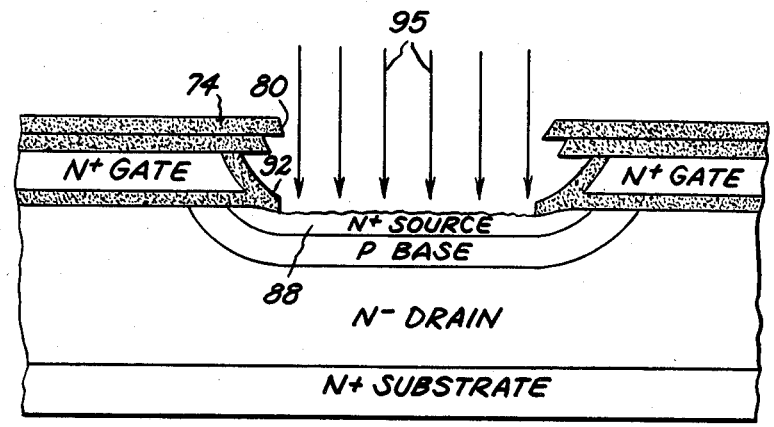
FIG. 6 depicts removal with a collimated beam of oxide grown over the source region.

Next, as depicted in FIG. 6, the oxide layer 92 (FIG. 5) on the surface of the source region 88 is removed preferably by reactive ion etching, or, alternatively, for example, by ion milling, with a collimated beam 95 having a high selectivity ratio for silicon dioxide over silicon. In one collimated beam ion etching process, the wafer is excited by an RF source which causes oscillatory movement of the etching ions perpendicular to the wafer surface so that a directional effect results. During removal of the oxide layer 92 with the collimated beam 95, the top or third layer 74 serves to protect the top surface of the MOSFET being formed, with the edge of the window 80 providing a shadow mask. As a result of this removal of the oxide layer 92 with the collimated beam 95, the silicon dioxide layer 92 on the sidewalls 84 of the polysilicon gate 70 is not removed.

Figure 7:
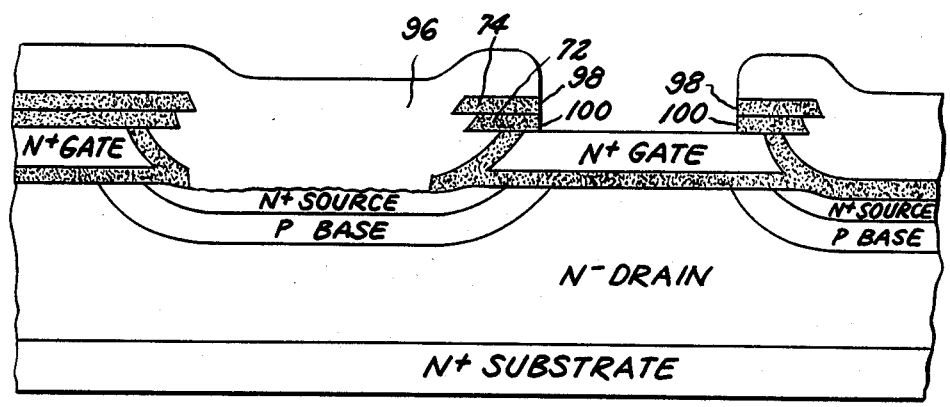
FIG. 7 depicts the second masking step and the subsequent etching to expose the gate electrode.

Next, as depicted in FIG. 7, a second photoresist mask 96 is applied for the purpose of defining the gate contact opening window. Using the mask 96, the third insulating layer 74, at least where it comprises silicon nitride, is plasma etched away and the second insulating layer 72, is chemically etched away to form openings 98 and 100 for the gate contact window. The second mask 96 is then removed, and the wafer cleaned.

Figure 8:
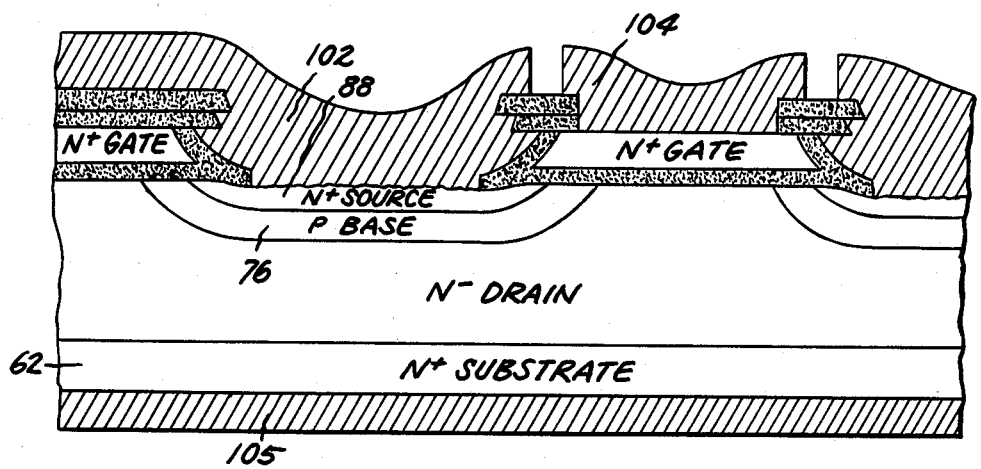
FIG. 8 depicts metallization of source and gate electrodes applied in combination with a third masking step.

Next, as depicted in FIG. 8, electrode metal, preferably aluminum, is coated, preferably by evaporation, onto the device and patterned as at 102 and 104 to form source and gate electrode layers. This patterning requires the third mask in the preferred process of the present invention. A common drain electrode 105 is also metallized onto the substrate 62, but requires no patterning.

In order to provide ohmic contact between the source 88 and base layers 76, the entire device is heat treated to cause microalloying as depicted in FIG. 9. In particular, microalloy spikes 103 are produced, which extend all the way through the source diffusion layer 88 and partly into the base diffusion 76. It will be appreciated that the precise process parameters must be selected to produce the desired results. However, by way of example, without intending to limit the scope of the invention, for an N+ source layer 88 which is less than about 0.7 microns thick, heating at 450° C. for one hour in a nitrogen atmosphere is sufficient to cause the desired degree of microalloying.

In the mechanism of microalloying, the silicon of the source 88 and base 76 layers dissolves in the aluminum source contact 102, allowing the microalloy spikes 103 to form downwardly.

The extent of the microalloying can be varied by controlling a number of parameters, for example (1) The particular metal employed for the contact electrode 102. Pure aluminum may be employed, or any number of aluminum-silicon alloys.

(2) The temperature and duration of the heat treatment, as well as the atmosphere.

(3) The substrate crystallographic orientation and surface condition.

(4) The source and base diffusion depths and concentrations.

It will be appreciated that this microalloying technique as depicted in FIG. 9 makes the required ohmic contact between the source 88 and base regions 76, eliminating the shorting bar 34 (FIG. 2) as required in the prior art MOSFET. Not only is the need for this particular masking step eliminated, but the unit cell size is reduced.

In accordance with the invention, there is provided a second technique for forming a source-base short in a power MOSFET which involved employing known preferential etching techniques to form a V-groove.

In the second technique in accordance with the invention, processing proceeds as described above beginning with FIG. 3 up through FIG. 6. The wafer substrate 60, however, is selected to have the particular crystallographic orientation of <100>.

Figure 10:
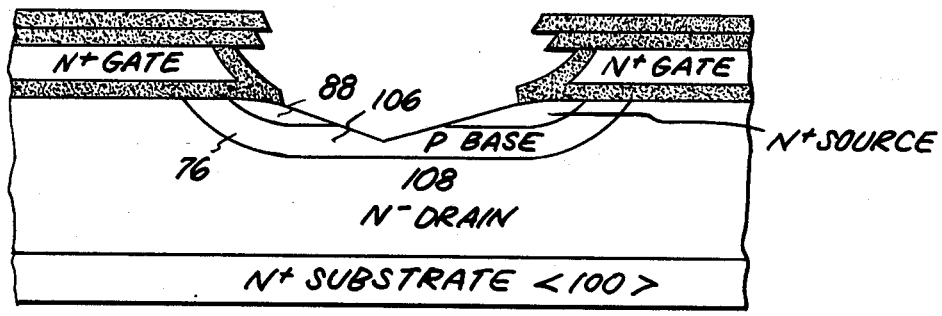
FIG. 10 depicts a V-groove formed by preferential etching in accordance with another aspect of the invention.

Referring to FIG. 10, following FIG. 6 as before, the source and base diffused regions 88 and 76 are preferentially etched to form a V-groove 106, the V-groove 106 extending all the way through the source region 88 with the bottom 108 of the V-groove 106 extending only partly into the base region 76. Various preferential etchants are known, any of which may be employed in the practice of the present invention. For example, one suitable etchant is a mixture of potassium hydroxide and isopropanol in a ratio of approximately 3:1. This particular etching mixture etches silicon at a rate of 5 microns per hour when the mixture is maintained at approximately 60° C. Other orientation-dependent etches may also be used in practicing the invention. For example, an article by Don L. Kendall, entitled "*On Etching Very Narrow Grooves In Silicon*", Applied *Physics Letters*, Volume 26, No. 4 pages 1951 ∝ 198 discusses suitable etchant such as a aqueous KOH solution.

In accordance with the invention, no particular additional masking step for the etching is required for the reason that the collimated beam step of FIG. 6 leaves all other areas protected by various insulating layers which, as described above, preferably comprise either silicon nitride or silicon dioxide.

Next, although not specifically illustrated with reference to the V-groove etching technique of the invention, the second mask is applied, such as the mask 96 depicted above with reference to FIG. 7, and the gate contact windows 98 and 100 are formed. This second mask 96 is then removed.

Figure 11:
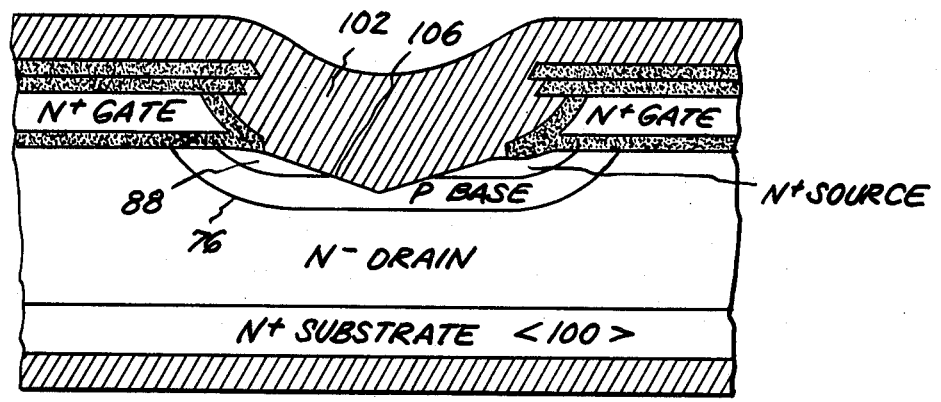
FIG. 11 depicts a unit cell with an integral source-base short formed by filling the V-groove with metallization.

Finally, as depicted in FIG. 11, metal is coated, preferably by evaporation, onto the device and patterned to form source and electrode layers, as described above with reference to FIG. 8. With the V-groove 106, the source electrode 102 is in ohmic contact with both the source 88 and base 76 regions.

While described hereinabove with particular reference to the self-aligned technique of the present invention, it will be appreciated that either of these methods for forming source-base shorts in a power MOSFET may be applied to other processes as well, generally comparable to those described hereinabove with prior art FIGS. 1 and 2.

While specific embodiments of the invention have been illustrated and described herein, it is realized that modifications and changes will occur to those skilled in the art. For example, if the base and source regions 76 and 88, respectively, are introduced into the drain region 64 of the power MOSFET of either FIG. 9 or FIG. 11 by means of ion implanting, rather than diffusion as specifically described above, then there is no need for the silicon dioxide layer 68 of FIG. 3 to be removed as in FIG. 4, and then replaced by the silicon dioxide layer 92, as in FIG. 5. This is because the appropriate impurities can be introduced into the drain region 64 by ion implanting directly through the silicon dioxide layer 68. Additionally, the source and drain electrode layers of the power MOSFET described above could be formed by a coating process comprising sputtering in contrast to evaporation, as described above. It is therefore to be understood that the appended claims are intended to cover the foregoing and all such modifications as fall within the true spirit and scope of the invention.

What is claimed is:

1. A method of manufacturing a self aligned power MOSFET, said method comprising:
   providing a silicon semiconductor wafer substrate including a drain region of one conductivity type having a principal surface;
   successively forming on the principal surface a first insulating layer, a conductive gate electrode layer, a second insulating layer, and a third insulating layer;

providing a first mask over said third insulating layer with a window for ultimately defining a base region and source region;

successively etching through a third insulating layer, the second insulating layer, and the conductive gate electrode layer to form openings in areas defined by the windows in the first mask, with undercutting of the conductive gate layer;

removing the first mask;

introducing into said drain region through the openings defined by the first mask impurities appropriate to form a first region of opposite conductivity type defining a base region of lateral extent determined in part by the size of the openings defined by the first mask;

introducing into said base region also through the openings defined by the first mask impurities appropriate to form a second region of the one conductivity type defining a source region entirely within the base region such that at the principal surface the first region exists as a band of opposite conductivity type between the source region and the drain region;

growing a layer of silcon dioxide on the sidewalls of the opening through the gate electrode layer;

removing with a collimated beam an insulative layer on the surface of the source region in an area defined by the opening in the third insulating layer defined by the first mask without removing the silicon dioxide layer on the sidewalls of the opening through the gate electrode layer;

providing a second mask with windows for defining a gate contact area on a portion of the wafer other than the location of the source region;

successively etching through the third insulating layer and the second insulating layer to form an opening in the window defined by the second mask to the gate electrode layer;

removing the second mask;

coating metal onto the wafer and then patterning the metal by means of a third mask to form source and gate electrode layers; and heating the wafer to form a microalloy spike extending from the metal source electrode through said second region and partly into said first region to produce an ohmic short between said first and second regions.

2. A method according to claim 1, further comprising etching through the first insulating layer after said successively etching through the third insulating layer, the second insulating layer, and the conductive gate electrode layer.

3. A method according to claim 2, further comprising growing a layer of silicon dioxide on the surface of the source region after said introducing of impurities into said base region to form the second region.

4. A method according to claim 1, wherein the first insulating layer comprises a single layer of silicon dioxide.

5. A method according to claim 1 or 4 wherein the second insulating layer comprises a single layer of silicon dioxide.

6. A method according to claim 1 or 4 wherein the third insulating layer comprises a single layer of silicon nitride.

7. A method according to claim 1, wherein removing the insulating layer with a collimated beam comprises removing the insulating layer by reactive ion etching with a collimated beam.

8. A method according to claim 1 wherein said introducing of impurities into said drain region to form the first region and said introducing of impurities into said base region to form the second region each comprises diffusion of impurities.

9. A method of manufacturing a self aligned power MOSFET, said method comprising:

providing a silicon semiconductor wafer substrate including a drain region of one conductivity type having a principal surface and having a crystallographic orientation of <100>;

successively forming on the principal surface a first insulating layer, a conductive gate electrode layer, a second insulating layer, and a third insulating layer;

providing a first mask over said third insulating layer with a window for ultimately defining a base region and a source region;

successively etching through the third insulating layer, the second insulating layer, and the conductive gate electrode layer to form openings in areas defined by the window in the first mask, with undercutting of the conductive gate layer;

removing the first mask;

introducing into said drain region through the openings defined by the first mask impurities appropriate to form a first region of opposite conductivity type defining a base region of lateral extent determined in part by the size of the openings defined by the first mask;

introducing into said base region also through the openings defined by the first mask impurities appropriate to form a second region of the one conductivity type defining a source region entirely within the base region such that at the principal surface the first region exists as a band of opposite conductivity type between the source region and the drain region;

growing a layer of silicon dioxide on the sidewalls of the opening through the gate electrode layer;

removing with a collimated beam an insulating layer on the surface of the source region in an area defined by the opening in the third insulating layer defined by the first mask without removing the silicon dioxide layer on the sidewalls of the opening through the gate electrode layer;

preferentially etching the second and first regions to form a V-groove, the V-groove extending through the second region and the bottom of the V-groove extending only partly into the first region;

providing a second mask with windows for defining at least one gate contact area on a portion of the wafer other than the locations of the source region;

successively etching through the third insulating layer and the second insulating layer to form an opening in the window defined by the second mask to the gate electrode layer; and removing the second mask;

coating metal onto the wafer and then patterning the metal by means of a third mask to form source and gate electrode layers; and the source electrode layers extending into the V-groove in ohmic contact with both said second and first regions.

10. A method according to claim 9, further comprising etching through the first insulating layer after said successively etching through the third insulating layer, the second insulating layer, and the conductive gate electrode layer.

11. A method according to claim 10, further comprising growing a layer of silicon dioxide on the surface of the source region after said introducing of impurities into said base region to form the second region.

12. A method according to claim 9 wherein the first insulating layer comprises a single layer of silicon dioxide.

13. A method according to claim 9 or 12 wherein the second insulating layer comprises a single layer of silicon dioxide.

14. A method according to claim 9 or 12, wherein the third insulating layer comprises a single layer of silicon nitride.

15. A method according to claim 9, wherein the removing of the insulating layer with a collimated beam comprises removing the insulating layer by reactive ion etching with a collimated beam.

16. A method according to claim 9 wherein said introducing of impurities into said drain region to form the first region and said introducing of impurities into said base region to form the second region each comprises diffusion of impurities.

17. A method of providing a short between the source and base layers of a self alinged power MOSFET formed of a semiconductor wafer, said MOSFEF including a semiconductor substrate having a drain region of one conductivity type and having a principal surface; a drain terminal electrically connected to the drain region; said method comprising:
    forming a gate insulating layer on said principal surface;
    forming a gate layer on said gate insulating layer;
    forming a device insulating layer on said gate layer;
    opening a first window through said device insulating layer, gate layer and gate insulating layer to expose a portion of said drain region and gate electrode;
    introducing a first region of opposite conductivity into said drain region through said opening;
    introducing a second region of said one conductivity into said base region through said opening;
    forming a source insulating layer over said second region and said exposed portions of said gate electrode;
    opening a second window through said source insulating layer, to expose a portion of said second region;
    opening a third window through said device insulating layer to expose a portion of said gate electrode;
    coating metal onto said wafer over the source region to form a source electrode; and
    heating the wafer to form at least one micro-alloy spike extending from the metal source electrode through the second region and partly into the first region to provide an ohmic short between the first and second regions.

18. A method according to claim 17, wherein the semiconductor substrate is silicon and the source contact metal is aluminum.

19. A method of providing a short between the source and base layers of a self aligned power MOSFET formed of a semiconductor wafer; said MOSFET including a semiconductor substrate including a drain region of one conductivity type, having a principal surface and having a crystallographic orientation of 100; a drain terminal electrically connected to the drain region; said method comprising:
    forming a gate insulating layer on said principal surface;
    forming a gate layer on said gate insulating layer;
    forming a device insulating layer on said gate layer;
    opening a first window through said device insulating layer, gate layer and gate insulating layer to expose portions of said drain region and gate electrode;
    introducing a first region of opposite conductivity into said drain region through said opening;
    introducing a second region of said one conductivity in to said base region through said opening;
    forming a source insulating layer over said second region and said exposed portions of said gate electrode;
    opening a second window through said source insulating layer, to expose a portion of said second region;
    preferentially etching the second and first regions to form a V-groove, the V-groove extending through the second region and the bottom of the V-groove extending only partly into the first region;
    opening a third window through said device insulating layer to expose a portion of said gate electrode;
    coating metal onto the wafer; and patterning the metal by means of a mask to form source and gate electrode layers; the source electrode layer extending into the V-groove in ohmic contact with both said second and first regions.

* * * * *